US008914710B2

(12) United States Patent
Ish-Shalom et al.

(10) Patent No.: US 8,914,710 B2
(45) Date of Patent: Dec. 16, 2014

(54) SOFT MESSAGE-PASSING DECODER WITH EFFICIENT MESSAGE COMPUTATION

(71) Applicant: Apple Inc., Cupertino, CA (US)

(72) Inventors: Tomer Ish-Shalom, Raanana (IL); Micha Anholt, Tel-Aviv (IL)

(73) Assignee: Apple Inc., Cupertino, CA (US)

( * ) Notice: Subject to any disclaimer, the term of this patent is extended or adjusted under 35 U.S.C. 154(b) by 167 days.

(21) Appl. No.: 13/628,321

(22) Filed: Sep. 27, 2012

(65) Prior Publication Data
US 2014/0089754 A1 Mar. 27, 2014

(51) Int. Cl.
H03M 13/00 (2006.01)

(52) U.S. Cl.
USPC ............ 714/774; 714/752; 714/755; 714/758

(58) Field of Classification Search
USPC .................. 714/752, 755, 758, 774
See application file for complete search history.

(56) References Cited

U.S. PATENT DOCUMENTS

| 7,831,883 | B2 | 11/2010 | Tong | |
|---|---|---|---|---|
| 2005/0193320 | A1* | 9/2005 | Varnica et al. | 714/800 |
| 2007/0083802 | A1* | 4/2007 | Xin et al. | 714/752 |
| 2007/0089019 | A1* | 4/2007 | Tang et al. | 714/752 |
| 2008/0052558 | A1* | 2/2008 | Sun et al. | 714/11 |
| 2009/0199071 | A1* | 8/2009 | Graef | 714/757 |
| 2010/0042902 | A1 | 2/2010 | Gunnam | |
| 2010/0070818 | A1 | 3/2010 | Ulriksson | |
| 2011/0087933 | A1* | 4/2011 | Varnica et al. | 714/704 |
| 2011/0131473 | A1* | 6/2011 | Mokhlesi et al. | 714/773 |
| 2012/0054576 | A1 | 3/2012 | Gross et al. | |

* cited by examiner

Primary Examiner — Sam Rizk
(74) Attorney, Agent, or Firm — Meyertons, Hood, Kivlin, Kowert & Goetzel, P.C.

(57) ABSTRACT

A method includes, in a decoder of an Error Correction Code (ECC), maintaining only aggregated information regarding a set of messages, a function of which is to be reported from a first node to a second node of the decoder. The function of the set is determined and reported using the aggregated information. After reporting the function, one of the messages in the set is replaced with a new message. The aggregated information is updated to reflect the set having the new message, and the function of the set having the new message is determined and reported using the updated aggregated information.

20 Claims, 3 Drawing Sheets

SOFT MESSAGE-PASSING DECODER WITH EFFICIENT MESSAGE COMPUTATION

FIELD OF THE INVENTION

The present invention relates generally to Error Correction Coding (ECC), and particularly to methods and systems for ECC decoding.

BACKGROUND OF THE INVENTION

Some types of error correction codes, such as Low Density Parity Check (LDPC) codes, are commonly decoded using iterative decoding processes. Various iterative decoding schemes and decoder configurations are known in the art.

For example, Cui et al. describe a matrix permutation scheme that enables efficient decoder implementation, in "Efficient Decoder Design for High-Throughput LDPC decoding," IEEE Asia Pacific Conference on Circuits and Systems, November, 2008, which is incorporated herein by reference. This paper also describes implementation schemes for min-sum based column-layered decoding.

SUMMARY OF THE INVENTION

An embodiment of the present invention that is described herein provides a method in a decoder of an Error Correction Code (ECC). The method includes maintaining only aggregated information regarding a set of messages, a function of which is to be reported from a first node to a second node of the decoder. The function of the set is determined and reported using the aggregated information. After reporting the function, one of the messages in the set is replaced with a new message. The aggregated information is updated to reflect the set having the new message, and the function of the set having the new message is determined and reported using the updated aggregated information.

In some embodiments, the ECC is defined by multiple equations defined over multiple variables, the first node includes a check node associated with one of the equations, and the second node includes a variable node associated with one of the variables. In an embodiment, the set of the messages includes the messages that were received in the first node during a most recent decoding iteration of the decoder. In a disclosed embodiment, replacing the one of the messages includes replacing a first message received from a given node in the first node during a previous decoding iteration of the decoder with the new message received from the given node in the first node during a current decoding iteration of the decoder.

In some embodiments, the function includes a minimum absolute value of the messages in the set, and maintaining the aggregated information includes maintaining, for each possible message value, a first indication of whether the message value exists in the set, and a second indication of a respective node from which the message value was received. Determining and reporting the minimum absolute value may include resetting the first indication of the message value that was last received from the second node, and then reporting a smallest absolute message value whose respective first indication is set. Updating the aggregated information may include updating the first indication of the message value of the new message to indicate that the new message exists in the set, and updating the second indication of the message value of the new message to indicate the node from which the new message was received.

In some embodiments, maintaining the aggregated information includes maintaining, for each possible message value, a respective count of occurrences of the message value in the set. In an embodiment, the function includes a minimum absolute value of the messages in the set, and determining and reporting the minimum includes decrementing the count of the message value that was last received from the second node, and then reporting a smallest absolute message value whose respective count is non-zero. In a disclosed embodiment, updating the aggregated information includes incrementing the count of the message value of the new message. There is additionally provided, in accordance with an embodiment of the present invention, an Error Correction Code (ECC) decoder including a plurality of node processors. A first node processor in the plurality includes a memory and logic circuitry. The memory is configured to hold aggregated information regarding a set of messages, a function of which is to be reported to a second node processor in the plurality. The logic circuitry is configured to determine and report the function of the set using the aggregated information, to replace one of the messages in the set with a new message after reporting the function, to update the aggregated information so as to reflect the set having the new message, and to determine and report the function of the set having the new message using the updated aggregated information.

The present invention will be more fully understood from the following detailed description of the embodiments thereof, taken together with the drawings in which:

DETAILED DESCRIPTION OF EMBODIMENTS

Overview

Figure 1:
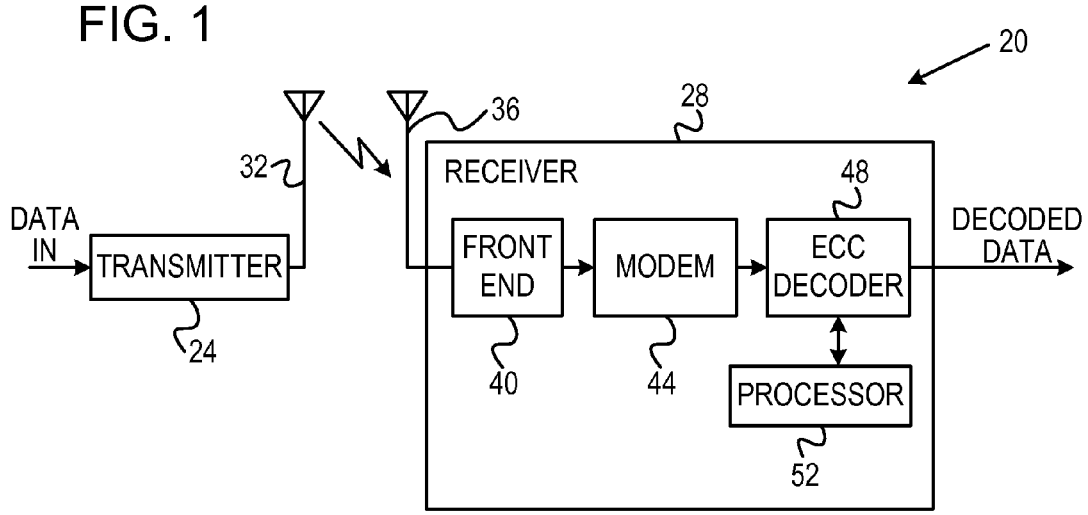
FIG. 1 is a block diagram that schematically illustrates a communication system that uses Error Correction Coding (ECC), in accordance with an embodiment of the present invention.

Some types of ECC, such as LDPC codes, are defined by multiple check equations that are defined over multiple variables. Some iterative ECC decoders comprise multiple check nodes corresponding to the check equations, and multiple variable nodes corresponding to the variables. The check node of a given equation is connected to the variable nodes of the variables that appear in that equation. A decoder of this sort decodes the ECC by exchanging messages between check nodes and variable nodes that are connected to one another, attempting to converge to a state where the variable nodes hold a valid code word.

In some decoding processes, the message sent from a given check node to a given variable node comprises a predefined function that is computed over the most updated messages received at the given check node from the other variable nodes, e.g., during the most recent decoding iteration. (An iteration is defined as a full scan over the check nodes and variable nodes.) For example, the function may comprise the minimal (absolute) message value received from the other variable nodes in the most recent iteration.

Embodiments of the present invention that are described herein provide improved methods and systems for calculating the messages from the check nodes to the variable nodes. In the disclosed embodiments, instead of storing in each check node all the messages received from the various variable nodes, the check nodes store only aggregated information regarding the received messages.

The aggregated information stored in a given check node is defined so as to (i) require small memory space, (ii) enable easy calculation of the messages for transmission to the variable nodes, and (iii) enable easy updating of the aggregated information upon reception of new messages from the variable nodes. The disclosed techniques assume that the messages received from the variable nodes are drawn from a small alphabet of possible message value.

Several examples of aggregated information are described herein. In an example embodiment, the aggregated information in a given check node comprises, for each possible message value, a flag indicating whether this message value was received in the most recent iteration, and an index of the variable node from which the message value was last received. In another embodiment, the aggregated information in a given check node comprises a histogram of the received message values, i.e., respective counts of occurrences of the various message values in the most recent iteration. Techniques for calculating the check node messages and for updating the aggregated information are also described.

The disclosed techniques can be used with various scheduling orders of scanning the check nodes and variable nodes. In contrast to naive solutions that store the raw messages received from the variable nodes, the use of aggregated information enables considerable reduction in memory space, computational complexity and power consumption in the decoder.

System Description

FIG. 1 is a block diagram that schematically illustrates a wireless communication system 20 that uses error correction coding, in accordance with an embodiment of the present invention. System 20 comprises a transmitter 24, which transmits data to a receiver 28. The transmitter accepts input data, encodes the data with a certain ECC, modulates the encoded data in accordance with a certain modulation scheme, converts the modulated digital signal to an analog signal, up-converts the analog signal to a suitable Radio frequency (RF), and transmits the RF signal toward the receiver using a transmit antenna 32.

In receiver 28, a receive antenna 36 receives the RF signal and provides it to a RF front end 40. The front end down-converts the RF signal to baseband or to a suitable Intermediate Frequency (IF), and digitizes the signal with a suitable Analog to Digital Converter (ADC—not shown in the figure). The digitized signal carrying the ECC-encoded data is demodulated by a modem 44, and the ECC is decoded by an ECC decoder 48. Decoder 48 is controlled by a processor 52. The structure and functionality of decoder 48 are described in detail below. By decoding the ECC, decoder 48 reconstructs the data that was input to transmitter 24. The reconstructed data is provided as the receiver output.

System 20 may comprise, for example, a cellular system, a satellite system, a point-to-point communication link, or any other suitable communication system that employs ECC. Although the example of FIG. 1 refers to a wireless communication system, the techniques described herein can be used with wire-line communication systems, such as cable communication systems, as well.

Figure 2:
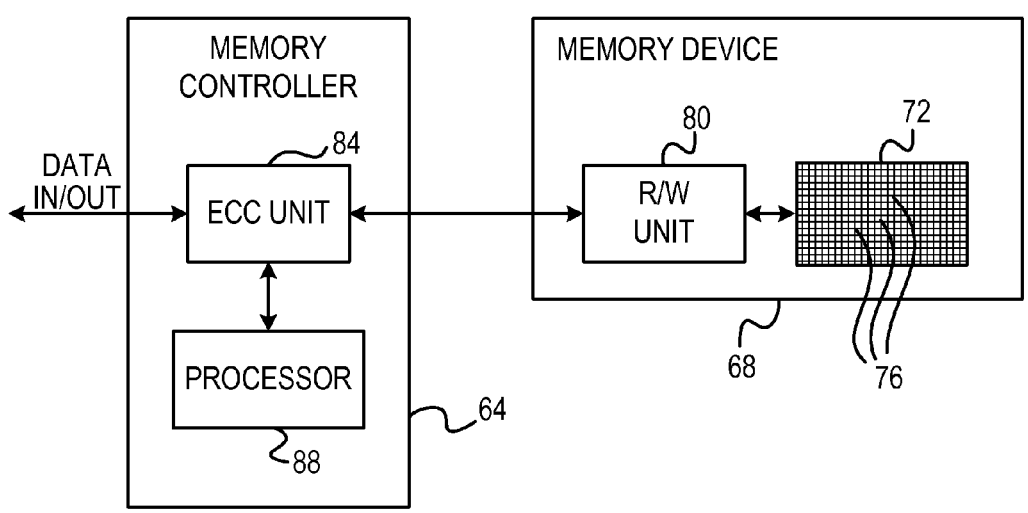
FIG. 2 is a block diagram that schematically illustrates a memory system that uses Error Correction Coding (ECC), in accordance with an embodiment of the present invention.

FIG. 2 is a block diagram that schematically illustrates a data storage system 60 that uses error correction coding, in accordance with an alternative embodiment of the present invention. System 60 comprises a memory controller 64, which stores data in a memory device 68. The memory device comprises an array 72 comprising multiple memory cells 76. Array 72 may comprise any suitable type of volatile or non-volatile memory, such as, for example, Random Access Memory (RAM) or Flash memory. Alternatively, device 68 may comprise a magnetic storage device such as a Hard Disk Drive (HDD), or any other suitable storage medium. System 60 can be used in various host systems and devices, such as in computing devices, cellular phones or other communication terminals, removable memory modules, Solid State Disks (SSD), digital cameras, music and other media players and/or any other system or device in which data is stored and retrieved.

Memory device 68 comprises a Read/Write (R/W) unit 80, which writes data values into memory cells 76 and reads data values from the memory cells. Memory controller 64 comprises an ECC unit 84, which encodes the data for storage with a certain ECC, and decodes the ECC of data that is retrieved from the memory cells. Unit 84 is controlled by a processor 88. The structure and functionality of unit 84 are described in detail below. The ECC used in systems 20 and 60 may comprise, for example, a Low Density Parity Check (LDPC) code, as well as various other types of ECC.

The ECC decoding schemes described herein can be used in communication systems such as system 20, as well as in data storage systems such as system 60. The description that follows applies to both communication applications and to storage applications, and refers generally to an ECC decoder. Any reference to the ECC decoder applies to decoder 48 of system 20, as well as to the decoder functionality of unit 84 in system 60. Alternatively, the methods described herein can be carried out by any other suitable element in any other suitable system that involves ECC decoding.

Figure 3:
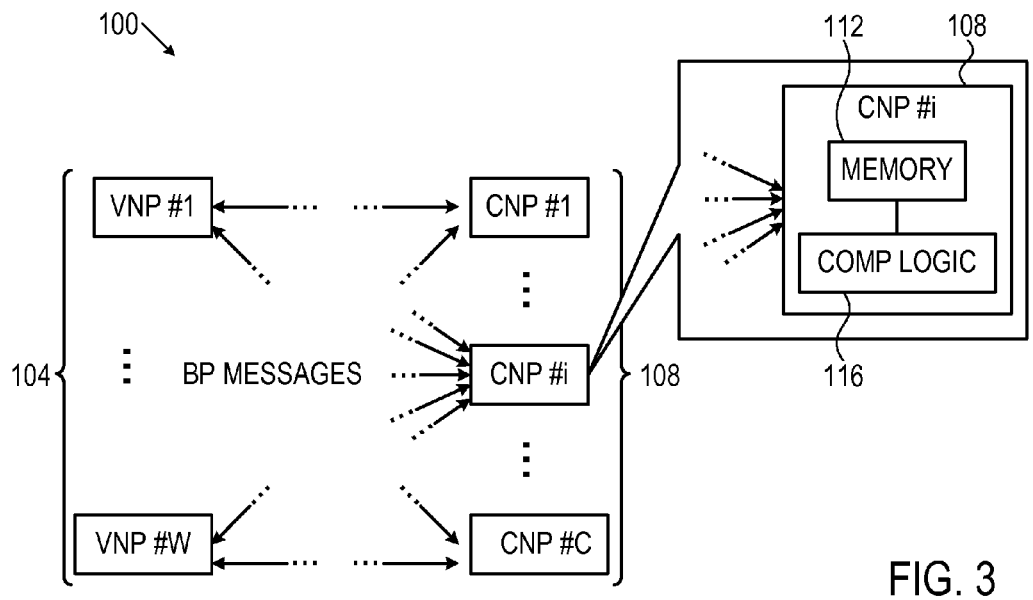
FIG. 3 is a block diagram that schematically illustrates a message-passing LDPC decoder, in accordance with an embodiment of the present invention.

FIG. 3 is a block diagram that schematically illustrates an iterative LDPC decoder 100, in accordance with an embodiment of the present invention. Decoder 100 can be used to implement decoder 48 of FIG. 1 above, or ECC unit 84 of FIG. 2 above. Decoder 100 accepts ECC code words, which may contain errors. In other words, the input code words may not always comprise valid code words of the ECC. The ECC decoder decodes the input code words while attempting to correct these errors, so as to reconstruct the data conveyed in the code words. In a typical implementation, each code word comprises on the order of several hundred to several thousand bits, although any other suitable code word size can be used.

The LDPC code in question is defined by a set of C check equations, which are defined over a set of V variables (e.g., bits for a binary LDPC code). Decoder 100 comprises a set of W Variable Node Processors (VNPs) 104 denoted VNP#1 . . . VNP#W, and a set of C Check Node Processors (CNPs) 108 denoted CNP#1 . . . CNP#C. Each VNP is associated with a respective variable, and each CNP is associated with a certain check equation.

VNPs 104 and CNPs 108 are connected by arcs (shown as arrows in the figure, in accordance with the check equations of the code. The VNP of each variable is connected to the CNPs of the equations in which that variable appears. The CNP of each equation is connected to the VNPs of the variables appearing in that equation. Since the LDPC code is sparse, each CNP is typically connected only to a small subset of the VNPs. Each CNP 108 comprises a respective memory 112 and respective computation logic circuitry 116 (referred to herein as "logic" for brevity), whose functions are explained in detail further below.

The description that follows refers mainly to binary LDPC codes, in which case the variable nodes are also referred to as bit nodes. The disclosed techniques, however, are similarly applicable to non-binary codes, as well.

In some embodiments, decoder 100 carries out an iterative Message-Passing (MP) decoding scheme. In an example MP scheme, VNPs 104 are initialized with the respective bit values of the input code word. The VNPs and CNPs exchange messages with one another over the arcs that connect them, attempting to converge to a state where the VNPs hold the bit values of a valid LDPC code word. This scheme is sometimes referred to as Belief Propagation (BP), and the messages exchanged between the VNPs and CNPs are sometimes referred to as BP messages. The messages from the CNPs to the VNPs are referred to herein as CNP messages, and the messages from the VNPs to the CNPs are referred to herein as VNP messages.

In the disclosed embodiments, CNPs 108 carry out an efficient process of calculating the BP messages, a process that simplifies the message calculation in logic 116 and uses only small memory space in memory 112. Example processes of this sort are described in detail below.

ECC decoder 48 of FIG. 1, ECC unit 84 of FIG. 2 and ECC decoder 100 of FIG. 3 may be implemented in software, in hardware, or using a combination of hardware and software elements. In some embodiments, decoder 48, unit and/or decoder 100 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In some embodiments, decoder 48, unit 84 and/or decoder 100 (including VNPs 104, and CNPs 108 including memory 112 and logic 116) are implemented in hardware, such as using one or more Application-Specific Integrated Circuits (ASICs), Field-Programmable gate Arrays (FPGAs) and/or discrete components. Some or all of the decoder functions may alternatively be implemented in software, or using a combination of software and hardware elements.

Efficient CNP Message Calculation Using Aggregated Information Regarding VNP Messages In some embodiments, the iterative decoding process scans VNPs 104 and CNPs 108 sequentially in some scheduling order. A full scan over the VNPs and CNPs is referred to herein as a decoding iteration, or simply "iteration" for brevity. An example of an iterative process of this sort is described in the paper by Cui et al., cited above. Alternatively, any other suitable process can be used.

When its turn arrives, each CNP sends messages to its connected VNPs and receives messages from its connected VNPs. The message value sent from a given CNP to a given VNP comprises a predefined function computed by logic 116 over a set of messages. The set of messages typically comprises the most updated messages received in the given CNP from the VNPs other than the given VNP, e.g., during the most recent decoding iteration. (Typically, the VNP and CNP messages are signed, i.e., have both magnitudes and signs. The disclosed techniques typically refer to the absolute values of the messages, i.e., to the message magnitudes. The sign information of the messages is typically also exchanged between the CNPs and VNPs but processed separately.)

Typically, the function computed by logic 116 comprises some approximation of:
- Taking the hyperbolic tangent of each message;
- Multiplying the hyperbolic tangents of the messages with one another; and
- Taking the inverse hyperbolic tangent of the product.

In some embodiments, the function comprises the minimum (in absolute value) over the messages in the set. This approximation is referred to as the "min-sum" approximation. Alternatively, logic 116 may compute any other suitable approximation.

Upon receiving a new message from a given VNP, the CNP typically replaces the previous message received from this VNP, and re-evaluates the function to reflect the newly-received message. One possible implementation would be to store in the CNP all the messages received from the various VNPs, and to re-compute the function upon updating the set with a new message. This sort of solution, however, is highly inefficient in terms of memory space and computational complexity.

In the embodiments described herein, each CNP 108 holds in memory 112 only aggregated information regarding the set of messages. The aggregated information is defined such that logic 116 in the CNP is able to (i) easily update the aggregated information to reflect a newly-received VNP message, and (ii) easily derive the predefined function (e.g., the minimal absolute message value in the set) from the aggregated information. Moreover, the aggregated information occupies only a fraction of the memory space that would be needed for storing the entire set of messages. Furthermore, the use of aggregated information reduces the decoder power consumption. The embodiments described herein assume that the messages received from the VNPs are selected from a small finite alphabet, e.g., eight possible three-bit messages $\{0,1,2,3,4,5,6,7\}$.

Min-Sum Calculation Using Aggregated Information

Consider first an embodiment in which the predefined function comprises the min-sum approximation, i.e., the minimal (absolute) message value in the set. In an example embodiment, each CNP 108 maintains in memory 112 the following information for each possible message:

- A Boolean flag denoted 'EXIST', indicating whether this message value was received in the most recent decoding iteration.
- An index of the VNP from which the message value was last received. This VNP index can be stored, for example, by incrementing a counter during scanning of the VNPs, and storing the counter value when a given message value is received.

For example, when there are eight possible message values $\{0,1,2,3,4,5,6,7\}$, the aggregated information stored in each CNP comprises eight Boolean flags and eight indices. In these embodiments, the minimal message value in the set is given by the smallest message value whose 'EXIST' flag is 'TRUE'. Upon receiving a new VNP message, the aggregated information can be updated by:

- Setting the 'EXIST' flag of the new message value to 'TRUE';
- Setting the VNP index corresponding to the new message value to the VNP index of the VNP from which the new message was received; and
- Setting the 'EXIST' flag of the message value that was received from the same VNP in the previous iteration to 'FALSE'.

Figure 4:
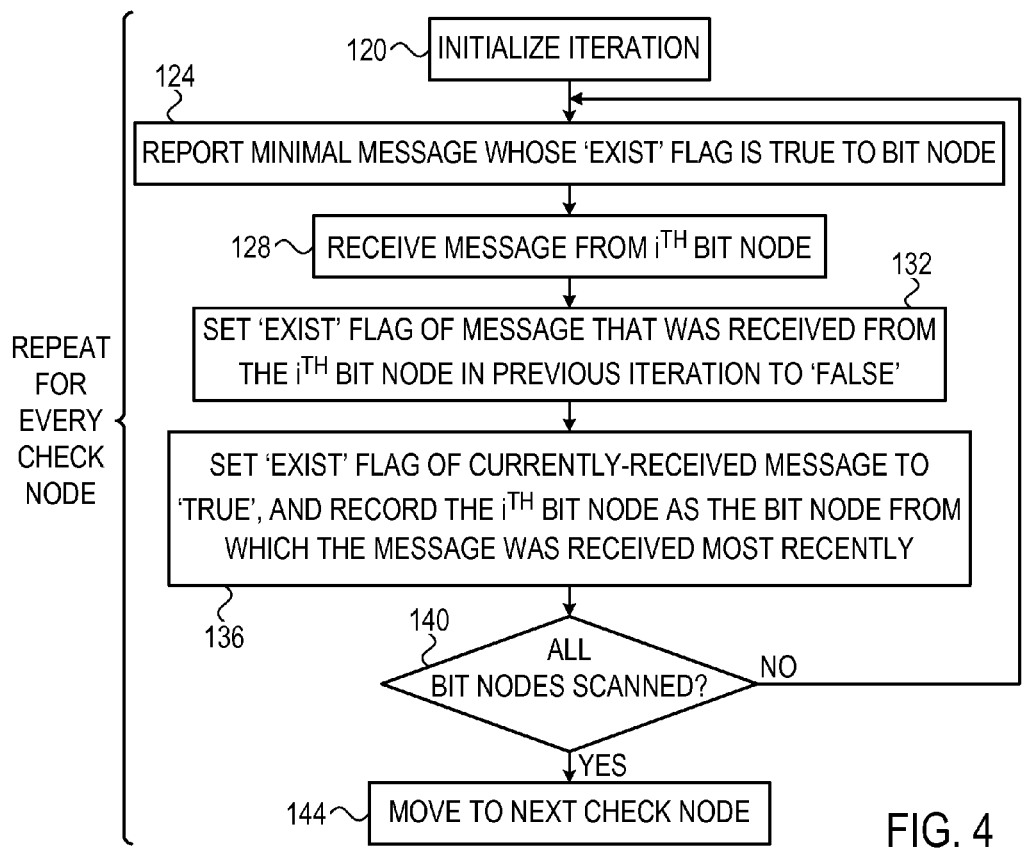
FIGS. 4 and 5 are flow charts that schematically illustrate methods for LDPC decoding, in accordance with embodiments of the present invention.

FIG. 4 is a flow chart that schematically illustrates a method for LDPC decoding, in accordance with an embodiment of the present invention. The method begins with logic 116 of a given CNP 108 initializing the next decoding iteration, at an initialization step 120. Typically, logic 116 initializes the 'EXIST' flags of all possible message values to 'FALSE'.

Decoder 100 then begins to scan the VNPs and CNPs. In the present example, an outer loop scans the CNPs and an inner loop scans the VNPs for the currently-scanned CNP. (This scheduling order is sometimes referred to as "serial V" or "column-layered". In alternative embodiments, the outer loop scans the VNPs and the inner loop scans the CNPs for the currently-scanned VNP. The latter scheduling order is sometimes referred to as "serial C" or row-layered. Hybrid scheduling orders are also feasible.)

In some embodiments, the variables are partitioned into groups that are referred to as variable layers. The variables in a given variable layer may be processed concurrently, or in any desired order, since they are independent of one another. The term "independent variables" in this context means that they do not appear together in any check equation. A group of variables is said to be independent if every pair of variables in the group is independent. The variable layers are typically processed sequentially, since variables in different layers may depend on one another.

The description that follows assumes that each variable node corresponds to a respective VNP. In such embodiments, terms such as "a message received from a given VNP" and "a message received from a given variable node" are interchangeable. In alternative embodiments, there may not necessarily be one-to-one correspondence between variable nodes and VNPs. For example, in an example implementation each VNP may process the variable nodes of a respective variable layer. In such embodiments, the term "message sent/received to/from a given VNP" in the description that follows should be regarded as "message sent/received to/from a given variable node".

For a given CNP, logic 116 of the given CNP sends a CNP message to the $i^{th}$ VNP, at a CNP message transmission step 124. In the CNP message, the CNP reports to the $i^{th}$ VNP the smallest message value for which the 'EXIST' flag is 'TRUE'. When finding the smallest message value, logic 116 disregards the message that was received from the $i^{th}$ VNP. (An alternative implementation is to modify the order of steps in FIG. 4, such that step 132 is carried out before step 124.)

Logic 116 of the given CNP receives a VNP message from the $i^{th}$ VNP, at a VNP message reception step 128. Logic 116 sets the 'EXIST' flag corresponding to the message value, which was received from the $i^{th}$ VNP in the previous iteration, to 'FALSE', at a flag resetting step 132.

Logic 116 of the given CNP then updates the 'EXIST' flag and the VNP index corresponding to the newly-received VNP message, at an updating step 136: Logic 116 sets the 'EXIST' flag of the newly-received message value to 'TRUE', and updates the corresponding VNP index to indicate the index of the $i^{th}$ VNP. (Note that a certain 'EXIST' flag may be set to 'FALSE' in step 132 and then to 'TRUE' in step 136, but these are not parallel and possibly conflicting operations.)

Logic 116 checks whether all VNPs were scanned for the given CNP, at a completion checking step 140. If so, logic 116 moves to the next CNP, at a CNP incrementing step 144. Otherwise, the method loops back to step 124 above for scanning the next VNP. The process of FIG. 4 is typically repeated by decoder 100 for each CNP.

The flow of FIG. 4 is an example flow that is chosen purely for the sake of conceptual clarity. In alternative embodiments, any other suitable flow can be used. For example, step 124 (sending the CNP message to the $i^{th}$ VNP) can be performed after steps 128-136 (after receiving and processing the VNP message from the $i^{th}$ VNP).

The 'EXIST' flags and VNP indices can be represented using any suitable format or representation scheme. In an example embodiment, an 'EXIST' flag and the corresponding VNP index can be represented by a single index having one invalid value. In this representation, the invalid value of the index corresponds to 'EXIST'='FALSE', and the other index values correspond to 'EXIST'='TRUE'.

In an embodiment, logic 116 maintains the 'EXIST' flags and VNP indices for all message values except the largest one. If, in a given iteration, the minimal message value is the largest of the possible message values, it is guaranteed that only this message value was observed in this iteration. Logic 116 may identify such a case by detecting that all other 'EXIST' flags are 'FALSE'. Thus, the 'EXIST' flag and VNP index of the largest message value is redundant and can be omitted.

Histogram-Based Aggregated Information

In alternative embodiments, the aggregated information maintained by logic 116 in memory 112 of a given CNP 108 comprises a histogram of the received VNP message values in the most recent iteration. The histogram comprises, for each possible VNP message value, a count of the number of occurrences of the VNP messages having this value that were received in the CNP in the most recent iteration.

In some embodiments, logic 116 uses the histogram to find the min-sum approximation, by finding the smallest message value whose count of occurrences is non-zero. Upon receiving a VNP message, updating the histogram can be performed by decrementing the count of the message value received from the same VNP in the previous iteration, and incrementing the count of the newly-received message value.

In alternative embodiments, logic 116 may use the histogram to evaluate various functions other than the min-sum approximation. The histogram conveys richer information regarding the VNP messages than the 'EXIST' flag mechanism. Therefore, functions based on the histogram may better approximate the hyperbolic tangent expression given above than the min-sum approximation.

Figure 5:
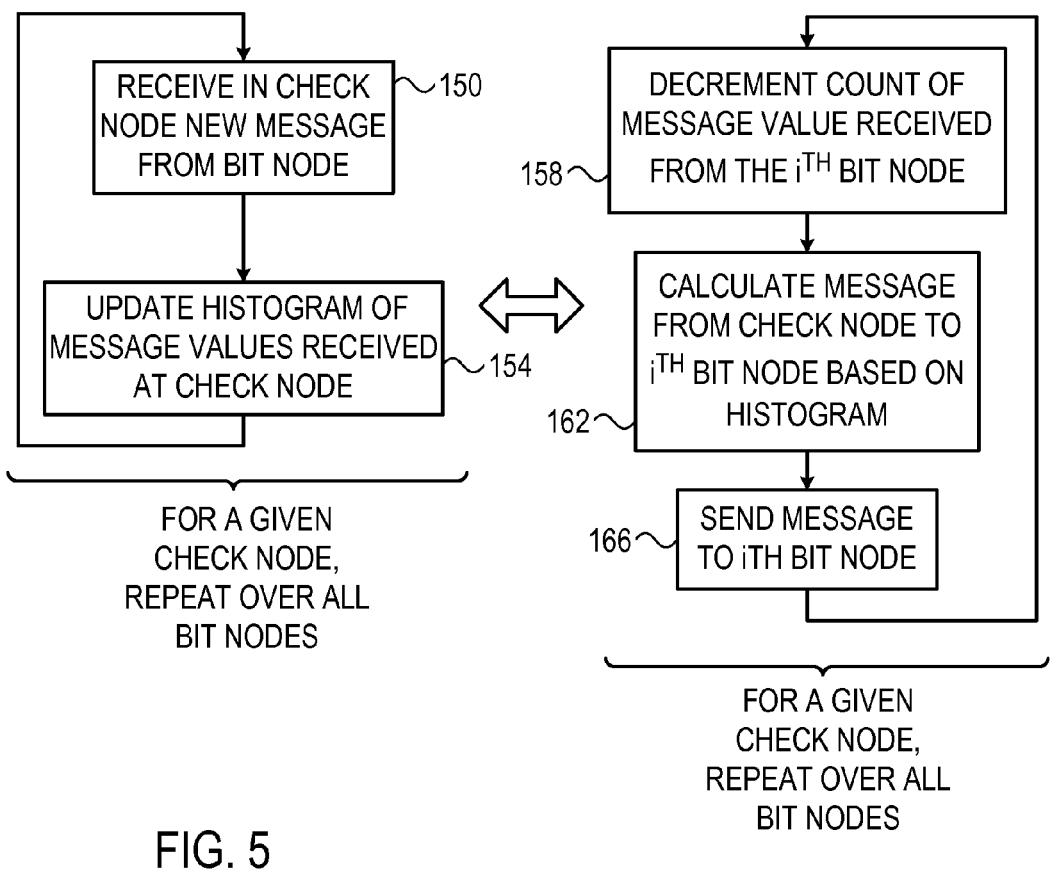

FIG. 5 is a flow chart that schematically illustrates a method for LDPC decoding, in accordance with an alternative embodiment of the present invention. The method of FIG. 5 comprises two processes that are interleaved with one another: A process of updating the histogram to reflect a newly-received VNP message (shown on the left-hand-side of the figure), and a process of calculating a CNP message for sending to a given VNP (shown on the right-hand-side of the figure). The two processes can be performed in any desired order.

The histogram updating process begins with logic 116 of a given CNP receiving a VNP message from a given VNP, at a VNP message reception step 150. Logic 116 updates the histogram to reflect the newly-received VNP message value, at a histogram updating step 154. As explained above, logic 116 decrements the count of the VNP message value received from the given VNP in the previous iteration, and increments the count of the newly-received message value. This process is repeated for each VNP 104 and CNP 108.

In order to send a CNP message to the $i^{th}$ VNP, the CNP message calculation process begins with logic 116 decrementing the count of the VNP message value received from the $i^{th}$ VNP in the previous iteration, at a decrementing step

158. Logic 116 then calculates the CNP message based on the histogram (e.g., takes the smallest message value whose count is non-zero), at a histogram-based calculation step 162. Logic 116 sends the CNP message to the $i^{th}$ VNP, at a CNP message transmission step 166. This process is repeated for each VNP 104 and CNP 108.

Note that in order to calculate the CNP message to be sent to the $i^{th}$ VNP, the last VNP message received from the $i^{th}$ VNP should be available to logic 116 at the time of calculation. In some embodiments, logic 116 saves these messages in memory 112. In alternative embodiments, logic 116 recalculates the VNP message when needed.

In some embodiments, the histogram does not necessarily hold counts for all the possible VNP message values. Typically, the total number of VNP messages received in a given CNP in a single iteration is the check degree of the check node (the number of VNPs connected to the CNP). This total number is typically known and fixed for each check node. Thus, the highest bin in the histogram (the count for the largest possible message value) can be omitted without loss of information. Logic 116 is able to reconstruct this count from the other histogram values. Typically, the largest possible message value (the "saturated" message) is the most commonly-occurring, and therefore the minimum number of bits needed for representing the histogram is reduced if this bin is dropped.

In some embodiments, the number of bits used for representing each histogram bin (i.e., each count) can be optimized so as to reduce the number of bits. For example, some of the bins can be saturated. If, for example, there are five bits per bin and bin 6 has a count of 32 messages, then the histogram value will be 31. When one or more bins are saturated, in some cases logic 116 may attempt to decrement a count that is already zero. In such a case, logic 116 typically retains this count at zero, assuming that the bin was saturated.

In some embodiments, if the number of bins in the histogram is small, it may be feasible for logic 116 to approximate the full BP expression (the hyperbolic tangent expression given above). Since the CNP message sent to a given VNP depends only on the VNP messages from other VNPs, only eight different messages are possible, and the full BP message values can be pre-computed. Moreover, the approximation can be improved since all the messages are known in advance: More accurate calculations can be performed because logic 116 does not process one message at a time and round the result.

Although the embodiments described herein refer mainly to codes that comprise discrete code words having a fixed finite size, the disclosed techniques can also be used with continuous, un-terminated codes such as convolutional LDPC. The disclosed techniques can also be used with terminated (e.g., "tail biting" or "zero-tail") convolutional LDPC codes that carry out multiple decoding iterations in parallel. Moreover, the techniques described herein can be used with decoders that use a single processor or with decoders that use multiple processors. Examples of convolutional LDPC codes and decoders having multiple processors are described, for example, by Ueng et al., in "Jointly designed architecture-aware LDPC convolutional codes and memory-based shuffled decoder architecture," IEEE Transactions on Signal Processing, vol. 60, no. 8, August, 2012, pages 4387-4402, which is incorporated herein by reference.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
in a decoder of an Error Correction Code (ECC), maintaining at least aggregated information regarding a set of messages, a function of which is to be reported from a first node to a second node of the decoder, wherein the aggregated information includes a plurality of indicators, wherein each of the plurality of indicators includes a value indicating the existence or non-existence of a corresponding value in the set of messages;
determining and reporting the function of the set using the aggregated information;
after reporting the function, replacing one of the messages in the set with a new message, and updating the aggregated information to reflect the set having the new message; and
determining and reporting the function of the set having the new message using the updated aggregated information.

2. The method according to claim 1, wherein the ECC is defined by multiple equations defined over multiple variables, wherein the first node comprises a check node associated with one of the equations, and wherein the second node comprises a variable node associated with one of the variables.

3. The method according to claim 1, wherein the set of the messages comprises the messages that were received in the first node during a most recent decoding iteration of the decoder.

4. The method according to claim 1, wherein replacing the one of the messages comprises replacing a first message received from a given node in the first node during a previous decoding iteration of the decoder with the new message received from the given node in the first node during a current decoding iteration of the decoder.

5. The method according to claim 1, wherein the function comprises a minimum absolute value of the messages in the set, and wherein maintaining the aggregated information comprises maintaining, for each possible message value, a corresponding index, wherein the corresponding index includes an index value corresponding to a respective node from which the message value was received.

6. The method according to claim 5, wherein determining and reporting the minimum absolute value comprises resetting a corresponding indicator of the plurality of indicators of the message value that was last received from the second node, and then reporting a smallest absolute message value whose respective indicator of the plurality of indicators is set.

7. The method according to claim 5, wherein updating the aggregated information comprises updating a corresponding indicator of the plurality of indicators of the message value of the new message to indicate that the new message exists in the set, and updating the corresponding index of the message value of the new message to indicate the node from which the new message was received.

8. The method according to claim 1, wherein maintaining the aggregated information comprises maintaining, for each possible message value, a respective count of occurrences of the message value in the set.

9. The method according to claim 8, wherein the function comprises a minimum absolute value of the messages in the set, and wherein determining and reporting the minimum comprises decrementing the count of the message value that was last received from the second node, and then reporting a smallest absolute message value whose respective count is non-zero.

10. The method according to claim 8, wherein updating the aggregated information comprises incrementing the count of the message value of the new message.

11. An Error Correction Code (ECC) decoder, comprising a plurality of node processors, wherein a first node processor in the plurality comprises:
a memory, which is configured to hold aggregated information regarding a set of messages, a function of which is to be reported to a second node processor in the plurality, wherein the aggregated information includes a plurality of indicators, wherein each of the plurality of indicators includes a value indicating the existence or non-existence of a corresponding value in the set of messages; and
logic circuitry, which is configured to determine and report the function of the set using the aggregated information, to replace one of the messages in the set with a new message after reporting the function, to update the aggregated information so as to reflect the set having the new message, and to determine and report the function of the set having the new message using the updated aggregated information.

12. The decoder according to claim 11, wherein the ECC is defined by multiple equations defined over multiple variables, wherein the first node processor comprises a check node processor associated with one of the equations, and wherein the second node processor comprises a variable node processor associated with one of the variables.

13. The decoder according to claim 11, wherein the set of the messages comprises the messages that were received in the first node processor during a most recent decoding iteration of the decoder.

14. The decoder according to claim 11, wherein the logic circuitry is configured to replace the one of the messages by replacing a first message received in the first node processor from a given node processor during a previous decoding iteration of the decoder with the new message received in the first node processor from the given node processor during a current decoding iteration of the decoder.

15. The decoder according to claim 11, wherein the function comprises a minimum absolute value of the messages in the set, and wherein the logic circuitry is configured to maintain the aggregated information by maintaining, for each possible message value, a corresponding index, wherein the corresponding index includes an index value corresponding to a respective node processor from which the message value was received.

16. The decoder according to claim 15, wherein the logic circuitry is configured to determine and report the minimum absolute value of the set by resetting a corresponding indicator of the plurality of indicators of the message value that was last received from the second node processor, and then reporting a smallest absolute message value whose respective indicator of the plurality of indicators is set.

17. The decoder according to claim 15, wherein the logic circuitry is configured to update the aggregated information by updating a corresponding indicator of the plurality of indicators of the message value of the new message to indicate that the new message exists in the set, and to update the corresponding index of the message value of the new message to indicate the node processor from which the new message was received.

18. The decoder according to claim 11, wherein the logic circuitry is configured to maintain the aggregated information by maintaining, for each possible message value, a respective count of occurrences of the message value in the set.

19. The decoder according to claim 18, wherein the function comprises a minimum absolute value of the messages in the set, and wherein the logic circuitry is configured to determine and report the minimum absolute value of the set by decrementing the count of the message value that was last received from the second node processor, and then reporting a smallest absolute message value whose respective count is non-zero.

20. The decoder according to claim 18, wherein the logic circuitry is configured to update the aggregated information by incrementing the count of the message value of the new message.

* * * * *